(12) United States Patent
Mangrum

(10) Patent No.: US 9,362,209 B1
(45) Date of Patent: Jun. 7, 2016

(54) SHIELDING TECHNIQUE FOR SEMICONDUCTOR PACKAGE INCLUDING METAL LID

(75) Inventor: Marc Alan Mangrum, Manchaca, TX (US)

(73) Assignee: Amkor Technology, Inc., Tempe, AZ (US)

( * ) Notice: Subject to any disclaimer, the term of this patent is extended or adjusted under 35 U.S.C. 154(b) by 342 days.

(21) Appl. No.: 13/356,349

(22) Filed: Jan. 23, 2012

(51) Int. Cl.
- H01L 23/495 (2006.01)
- H01L 23/498 (2006.01)
- H01L 23/043 (2006.01)
- H01L 23/48 (2006.01)

(52) U.S. Cl.
CPC ............ H01L 23/495 (2013.01); H01L 23/043 (2013.01); H01L 23/48 (2013.01); H01L 23/498 (2013.01)

(58) Field of Classification Search
CPC ... H01L 23/043; H01L 23/047; H01L 23/495; H01L 23/49503; H01L 23/49534; H01L 23/48
USPC .......................................................... 257/670
See application file for complete search history.

(56) References Cited

U.S. PATENT DOCUMENTS

| | | | |
|---|---|---|---|
| 5,939,784 A * | 8/1999 | Glenn ........................... | 257/710 |
| 6,222,259 B1 | 4/2001 | Park | |
| 6,528,876 B2 * | 3/2003 | Huang ........................... | 257/706 |
| 6,853,055 B1 * | 2/2005 | Kuang ........................... | 257/659 |
| 7,030,469 B2 | 4/2006 | Mahadevan | |
| 7,381,589 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 7,732,899 B1 * | 6/2010 | Berry et al. .................... | 257/666 |
| 7,831,049 B1 | 11/2010 | Li et al. | |
| 7,892,889 B2 | 2/2011 | Howard | |
| 7,898,066 B1 | 3/2011 | Scanlan | |
| 8,012,868 B1 | 9/2011 | Naval | |
| 8,018,049 B2 | 9/2011 | Minervini | |
| 8,362,598 B2 * | 1/2013 | Park et al. ..................... | 257/660 |
| 2004/0080917 A1 * | 4/2004 | Steddom et al. .............. | 361/748 |
| 2004/0184632 A1 | 9/2004 | Minervini | |
| 2004/0251538 A1 | 12/2004 | Lin | |
| 2007/0082421 A1 | 4/2007 | Minervini | |
| 2007/0090502 A1 | 4/2007 | Zhao | |
| 2007/0111379 A1 * | 5/2007 | Shim et al. ..................... | 438/106 |
| 2007/0201715 A1 | 8/2007 | Minervini | |
| 2007/0215962 A1 | 9/2007 | Minervini | |
| 2012/0218729 A1 * | 8/2012 | Carey et al. ................... | 361/807 |

* cited by examiner

*Primary Examiner* — Ermias Woldegeorgis
*Assistant Examiner* — Benjamin Tzu-Hung Liu
(74) *Attorney, Agent, or Firm* — Kevin B. Jackson

(57) ABSTRACT

In accordance with the present invention, there is provided a semiconductor package wherein a metal lid of the package is used as a shield that effectively surrounds the active circuitry, and thus forms a type of Faraday shield. The lid is electrically coupled to an internal die mounting pad of either a leadframe or an alternative type of substrate. Appropriate interconnect methods between the lid, the die pad, and the ground connections exterior to the semiconductor package include, but are not restricted to, conductive adhesives, wire bonding, bumps, tabs, or similar techniques.

18 Claims, 2 Drawing Sheets

SHIELDING TECHNIQUE FOR SEMICONDUCTOR PACKAGE INCLUDING METAL LID

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices and, more particularly, to a semiconductor package which includes a metal lid coupled to one or more prescribed metal features of the leadframe of the package to form a shield that effectively surrounds the active circuitry, thus creating a type of Faraday shield.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package comprise a metal leadframe, an integrated circuit or semiconductor die, bonding material to attach the semiconductor die to the leadframe, bond wires which electrically connect pads or contacts on the semiconductor die to individual leads of the leadframe, and a hard plastic encapsulant material which covers the other components and forms the exterior of the semiconductor package, commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body, or may be partially exposed therein for use in electrically connecting the semiconductor package to another, external component. In certain semiconductor packages, a portion of the die pad of the leadframe also remains exposed within the package body. Additionally, in other semiconductor package designs, the leadframe is substituted with a laminate substrate which includes conductive patterns adapted to facilitate the electrical connection thereof to both the semiconductor die and an external component. Still further, other semiconductor package designs such as cavity packages and hermetic packages often include a metal lid attached to other prescribed portions thereof, such as the package body of the package.

As the art has moved to smaller, lighter weight, and higher frequency electronic devices such as cellular telephones, semiconductor packages utilized in these electronic devices are increasingly placed closer to other electronic components and structures. Due to this reduced spacing, electromagnetic interference (EMI) or radio frequency (RF) radiation emanating from a semiconductor package has a greater probability of interfering with the normal operation of an adjacent electronic component, and vice-versa. In this regard, many applications using semiconductor packages that incorporate a metal lid (e.g., the cavity packages and hermetic packages described above) often also require a modality for shielding the active circuitry contained in the package from the effects of EMI and/or RF interference. As indicated above, in some applications, the shield is required to prevent the active circuitry contained within the package from emitting frequencies or "noise" that might affect the performance of the application or other components therein.

To prevent such unacceptable EMI and/or RF interference, it is known in the prior art to add one or more shields (often referred to as "cans" or "cages") to an application during the board level assembly process. These shields are typically attached to an underlying support structure such as a printed circuit board (PCB) to provide EMI/RF shielding to the electronic component(s) covered thereby. Though these shields are available in multiple designs and shapes, they are not always as effective as desired, and can further add as much as 15% to the overall manufacturing cost of the device depending upon the design and device performance specifications thereof. As a result, the inclusion of the shield(s) in the application typically adds cost, complexity, and support issues thereto. Still further, the efficacy of shielding cages is typically limited since such cages typically do not share an on-die or interior package reference ground. In this regard, establishing a common ground potential with a circuit device depends upon the PCB ground plane design and interconnect via technology utilized, as well as the solder joints of the package to the board.

Another technique employed in the prior art to prevent EMI and/or RF interference involves the use of conformal, conductive coatings. More particularly, in accordance with this technique, the entire package is coated with an impregnated conductive material such as Ag that is electrically connected to the ground reference of device. However, this technique does not work with MEMS devices or those requiring an external port or opening in the top or bottom of the package.

Yet another prior art technique to prevent unacceptable EMI and/or RF interference involves the application of a conformal shielding material to the package body of a semiconductor package, and establishing electrical communication between the shielding material and contact points on a prescribed surface of the package through the use of wires which extend through and protrude from the package body. However, this particular technique is limited to over-molded semiconductor packages and to those that have sufficient interior space to add those internal wires which facilitate the electrical communication with the shielding material. Moreover, such wires must be interstitially spaced around the perimeter of the semiconductor package as well as between other components if included in the interior thereof.

Thus, in the case of molded semiconductor packages that incorporate a lid, there are no known shielding techniques currently applied beyond conformal coatings, or the can and cage techniques described above. The present invention addresses this issue by allowing for the use of the lid as a shield that effectively surrounds the active circuitry, and thus forms a type of Faraday shield. In accordance with the present invention, the lid is coupled to an internal die mounting pad of either a leadframe or an alternative type of substrate. Appropriate interconnect methods between the lid, the die pad, and the ground connections exterior to the semiconductor package include, but are not restricted to, wire bonding, bumps, tabs, or similar techniques. These, as well as other features and advantages of the present invention will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
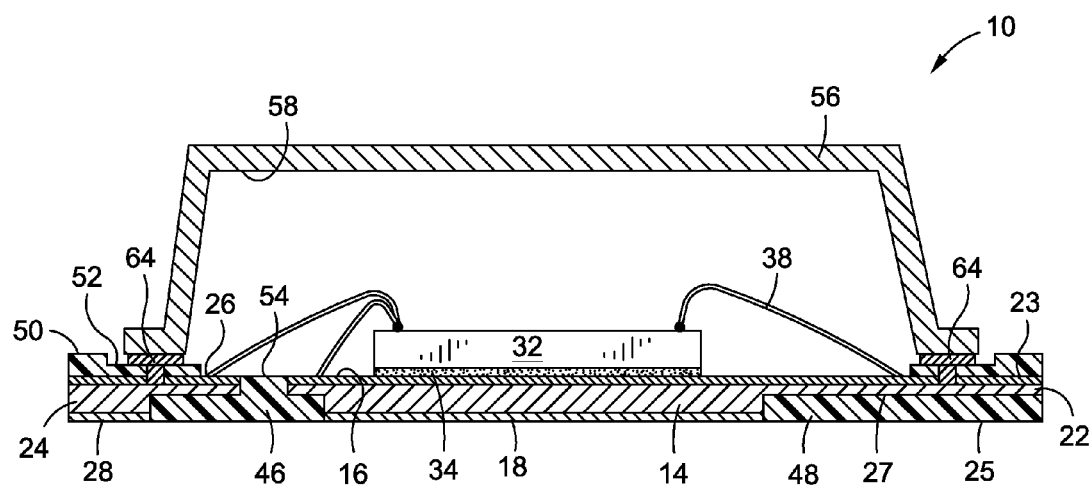
FIG. 1 is a cross-sectional view of a semiconductor package constructed in accordance with a first embodiment of the present invention.
Figure 2:
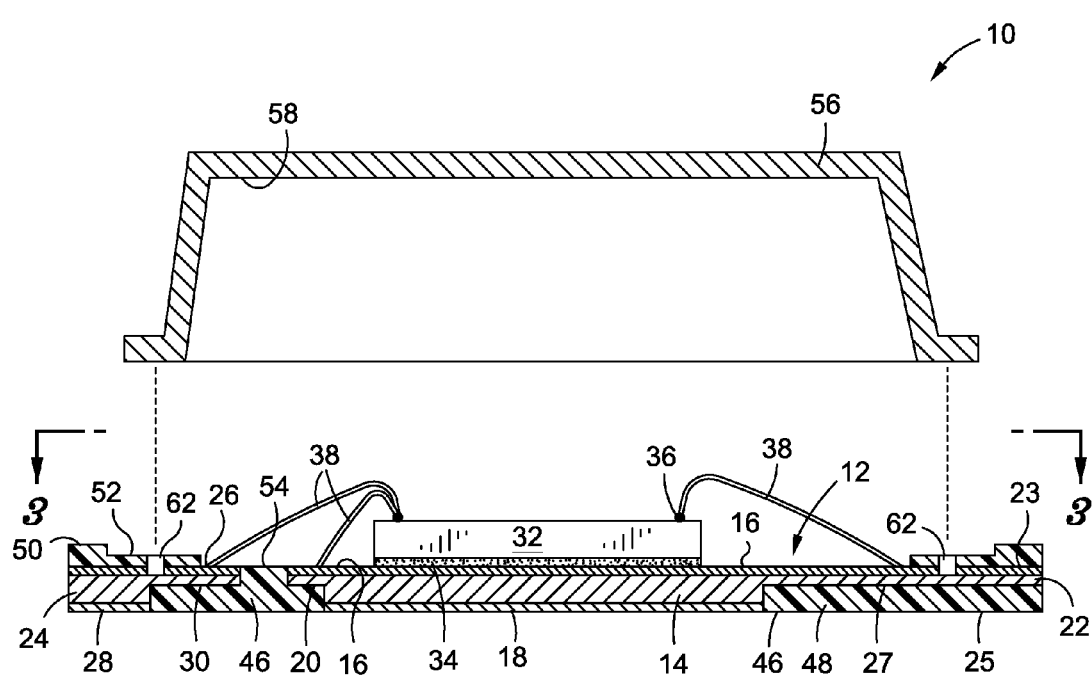
FIG. 2 is an exploded view of the semiconductor package shown in FIG. 1.
Figure 3:
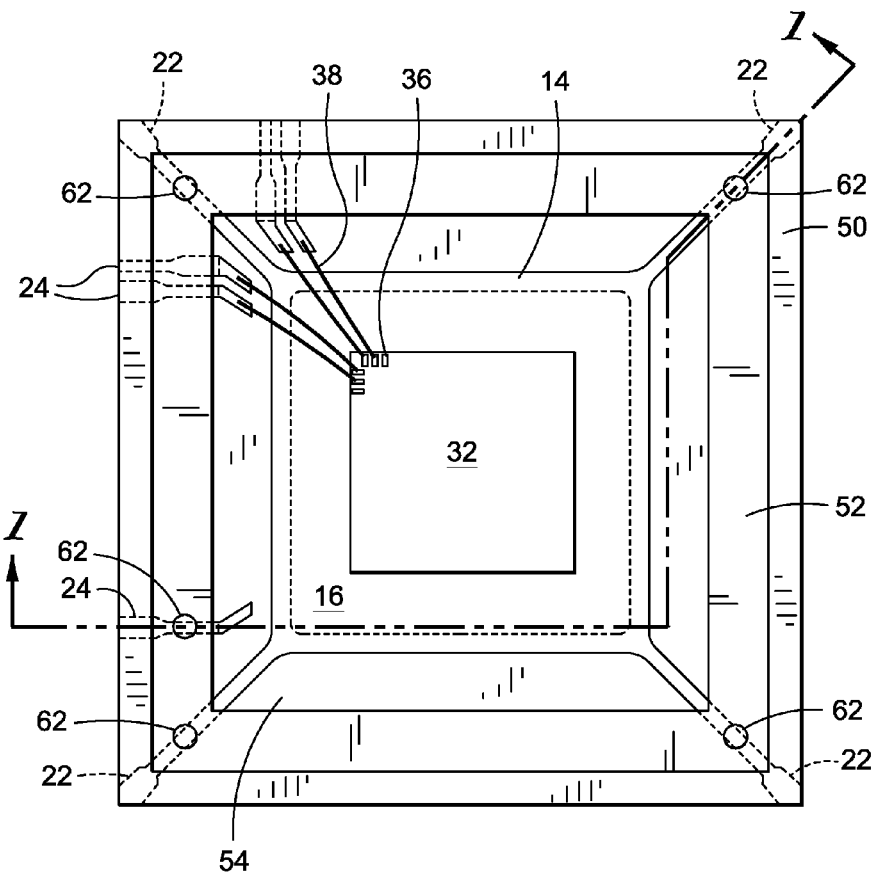
FIG. 3 is a top plan view of the semiconductor package shown in FIG. 2 taken along line 3-3 thereof, the semiconductor package being shown in a partially assembled state prior to the attachment of the lid thereto, with the line 1-1 of FIG. 3 corresponding to the cross-sectional view of the leadframe and package body of the semiconductor package as shown in FIG. 1.

Referring now to the drawings wherein the showings are for purposes of illustrating preferred embodiments of the present invention only, and not for purposes of limiting the same, FIGS. 1-3 depict a semiconductor package 10 constructed in accordance with a first embodiment of the present invention. One of the structural features of the semiconductor package 10 is its leadframe 12. The leadframe 12 comprises a die paddle or die pad 14 which has a generally quadrangular (e.g., at least four sides and four angles) configuration, and defines four peripheral edge segments. The die pad 14 also defines a generally planar top surface 16, and an opposed, generally planar bottom surface 18. In the process of fabricating the leadframe 12, the die pad 14 is preferably subjected to a partial etching process which facilitates the formation of a recessed shoulder or shelf 20 therein. The shelf 20 substantially circumvents the bottom surface 18 of the die pad 14, and is disposed in opposed relation to the peripheral portion of the top surface 16 thereof. The depth of the shelf 20 is preferably about half of the total thickness of the die pad 14 (i.e., the distance separating the top and bottom surfaces 16, 18 from each other). The functionality of the shelf 20 will be discussed in more detail below.

The leadframe 12 also includes a plurality of tie bars 22 which are integrally connected to and extend diagonally from respective ones of the four corner regions defined by the die pad 14. Each of the tie bars 22 defines a generally planar top surface 23 which extends in generally coplanar relation to the top surface 16 of the die pad 14. During the fabrication of the leadframe 12, each of the tie bars 22 is preferably subjected to a partial etching process which results in each of the tie bars 22 defining an etched bottom surface 27 which extends in generally coplanar relation to the shelf 20.

In addition to the die pad 14 and tie bars 22, the leadframe 12 comprises a plurality of leads 24. Though only several exemplary leads 24 are shown in FIG. 3, in the leadframe 12, the leads 24 are preferably segregated into four sets, with each set of the leads 24 extending along and in spaced relation to a respective one of the peripheral edge segments defined by the die pad 14. As seen in FIGS. 1 and 2, each of the leads 24 defines a generally planar top surface 26 and an opposed, generally planar bottom surface 28. The top surface 26 extends in generally coplanar relation to the top surface 16 of the die pad 14, as well as the top surfaces 23 of the tie bars 22. The bottom surface 28 of each lead 24 extends in generally coplanar relation to the bottom surface 18 of the die pad 14 and the bottom surfaces 25 of the tie bars 22. Though the leads 24 may be formed to have any one of a multiplicity of differing shapes or configurations, in the exemplary embodiment shown in FIG. 3, each of the leads 24 is preferably formed to include an inner end portion which is angularly offset relative to the remainder thereof.

In fabricating the leadframe 12, each lead 24 is subjected to a partial etching process which results in the inner end portion thereof being of a reduced thickness as is shown with particularity in FIGS. 1 and 2. It is contemplated that the partial etching of each lead 24 will be completed such that the thickness of the inner end portion is approximately (but not limited to) one-half the total thickness of the lead 24 (i.e., the distance between the top and bottom surfaces 26, 28). Additionally, the partial or half-etching of the inner end portion of each lead 24 preferably occurs such that upon the completion of the etching process, each inner end portion defines a shelf 30 which is recessed relative to the bottom surface 28. In the leadframe 12, the shelf 30 of the inner end portion of each lead 24 extends in generally coplanar relation to the shelf 20 of the die pad 14 and the etched bottom surfaces 27 of the tie bars 22.

In the semiconductor package 10 it is contemplated that the leadframe 12 will be fabricated from a copper-based material, a copper alloy-based material, steel, non-ferrous, or an alloy material such as Alloy 42 having suitable conductive metal plating layers applied thereto. As such, as is best seen in FIGS. 1 and 2, the top and bottom surfaces 16, 18 of the die pad 14, the top and bottom surfaces 26, 28 of each of the leads 24, and the top surfaces 23 of each of the tie bars 22 are each actually defined by one of the plating layers applied to the underlying copper, copper alloy or Alloy 42 material.

In addition to the leadframe 12, the semiconductor package 10 comprises a semiconductor die 32 which is attached to the top surface 16 of the die pad 14. More particularly, the semiconductor die 32 defines opposed, generally planar top and bottom surfaces, with the bottom surface of the semiconductor die 32 being attached to a central portion of the top surface 16 of the die pad 14 through the use of a layer 34 of a suitable adhesive, such as a conductive or non-conductive epoxy or a conductive or non-conductive die attach film. Disposed on a peripheral portion of the top surface of the semiconductor die 32 is a plurality of conductive terminals 36, at least some of which are electrically connected to respective ones of the leads 24 through the use of conductive wires 38. It is contemplated that for those terminals 36 electrically connected to the leads 24, the corresponding wires 38 will extend between the terminals 36 and the top surfaces 26 of corresponding ones of the leads 24. As further shown in FIGS. 1 and 2, it is also contemplated that wires 38 may be used to facilitate the electrical connection of one or more of the terminals 36 to a peripheral portion of the top surface 16 of the die pad 14 to provide a grounding function.

In the semiconductor package 10, portions of the leadframe 12, and in particular the die pad 14, tie bars 22 and leads 24 thereof, are covered by an encapsulant material which ultimately hardens into a package body 46 of the semiconductor package 10. When the encapsulant material used to form the package body 46 is initially applied to the leadframe 12, such encapsulant material flows over and covers the side surface of the die pad 14, including the shelf 20 thereof. The encapsulant material also covers the side surfaces of the inner end portions of the leads 24, the shelves 30 defined by the inner end portions 32, and the etched bottom surfaces 27 of the tie bars 22. The encapsulant material also flows between adjacent pairs of the leads 24, between the leads 24 and the tie bars 22, and between the leads 24 and the die pad 14.

Though the encapsulant material does not cover the top or bottom surfaces 16, 18 of the die pad 14, or the bottom surfaces 28 of the leads 24, it does cover portions of the top surfaces 26 of the leads 24, as well as portions of the top surfaces 23 of the tie bars 22. As such, the fully formed package body 46 defines a bottom surface 48 which extends in generally co-planar relation to the bottom surface 18 of the die pad 14 and the bottom surfaces 28 of the leads 24. The package body 46 also defines a top surface which is not generally planar, but rather has a stepped configuration defining a generally planar inner, first section 54, a generally planar middle, second section 52 which circumvents the first section 54, and a generally planar peripheral or outer third section 50 which circumvents the second section 52. When viewed from the perspective shown in FIGS. 1 and 2, the second section 52 of the top surface of the package body 46 is recessed relative to the third section 50, with the first section 54 in turn being recessed relative to the second section 52. In this regard, the first section 54 of the top surface of the package body 46 extends in generally coplanar relation to the top surface 16 of the die pad 14, the top surfaces 26 of the leads 24, and the top surfaces 23 of the tie bars 22.

As seen in FIGS. 1-3, portions of the top surfaces 26 of the leads 24 and the top surfaces 23 of the tie bars 22 are covered by those portions of the package body 46 which define the second and third sections 52, 50 of the top surface thereof. However, at least those portions of the top surfaces 26 of the leads 24 which define the inner end portions thereof are not covered by the package body 46, but rather are exposed in and substantially flush or coplanar with the first section 54 of the top surface thereof as indicated above. Also exposed in and substantially coplanar with the first section 54 of the top surface of the package body 46 are portions of the top surfaces 23 of the tie bars 22. Advantageously, the flow of the encapsulant material used to form the package body 46 over the shelves 20, 30 creates an effective mechanical interlock between the die pad 14, leads 24 and package body 46.

In the semiconductor package 10, the package body 46 is subjected to an ablation process (e.g., laser ablation) as results in the formation of one or more vias 62 therein. The via(s) 62 are formed in the second section 52 of the top surface of the package body 46 in a prescribed pattern or arrangement. More particularly, the via(s) 62 are formed so as to extend to the top surface(s) 23 of one or more of the tie bars 22 and/or to the top surface(s) 26 of one or more of the leads 24. In the exemplary arrangement shown in FIG. 3, four vias 62 are formed in the second section 52 so as to extend to the top surfaces 23 of respective ones of the tie bars 22, with one additional via 62 being formed in the second section 52 so as to extend to the top surface 26 of a corresponding one of the leads 24. However, those of ordinary skill in the art will recognize that the total number and arrangement of vias 62 formed in the package body 46 may be varied, and that the via(s) 62 may be extended to any tie bar(s) 22 and/or to any lead(s) 24 in any combination. However, it is contemplated that at least one via 62 will be formed in the second section 52 so as to extend to the top surface 23 of a corresponding tie bar 22. It is contemplated the via 62 may be formed in any one of a multiplicity of different shapes (e.g., circular, elongated, non-circular trench, etc.) without departing from the spirit and scope of the present invention.

The semiconductor package 10 further comprises a metal lid 56 which is attached to the package body 46 through the use of conventional assembly methods. As seen in FIGS. 1 and 2, the lid 56 defines a peripheral rim which is attached to the second section 52 of the top surface of the package body 46 through the use of a layer of a conductive material 64 (e.g., a conductive epoxy, conductive film, conductive polymer, etc.). The lid 56 thus covers or shields the semiconductor die 32, as well as the wires 38. Importantly, the conductive material 64 flows through any vias 62 formed in the second section 52, and thus into conductive communication with the tie bar(s) 22 and/or lead(s) 24 with which it comes into contact. As result, the metal lid 56 is electrically connected by the conductive adhesive material 64 to any tie bars(s) 22 and/or any lead(s) 24 corresponding to or aligned with any via(s) 62 formed in the second section 52 of the top surface of the package body 46.

As indicated above, it is contemplated that at least one via 62 will be formed in the second section 52 so as to extend to the top surface 23 of a corresponding tie bar 22, thus facilitating the creation of an electrical path between the metal lid 56 and the die pad 14 as a result of the integral connection of each of the tie bars 22 to the die pad 14. By virtue of this electrical connection of the lid 56 to the die pad 14, an effective ground or electrically neutral potential is established which surrounds the semiconductor die 32, thus creating a shield. This shield is effective for both EMI and RF noise. Stated another way, the electrical continuity established between the lid 56 and the die pad 14 effectively places them at the same electrical potential, thus creating the shield around the active circuitry of the semiconductor package 10. It is estimated that the performance of the shielding facilitated by the above-described structural features thereof will provide, at the very least, effective shielding at high frequencies in the range of 2-3 GHz and 10-100 Hz on the low end. In the semiconductor package 10, the wire(s) 38 which are covered by the lid 56 and facilitate the electrical connection of the semiconductor die 32 to the die pad 14 enhance the effectiveness of the shielding while minimizing or eliminating ground bounce and the effects of ESD reactants.

Figure 4:
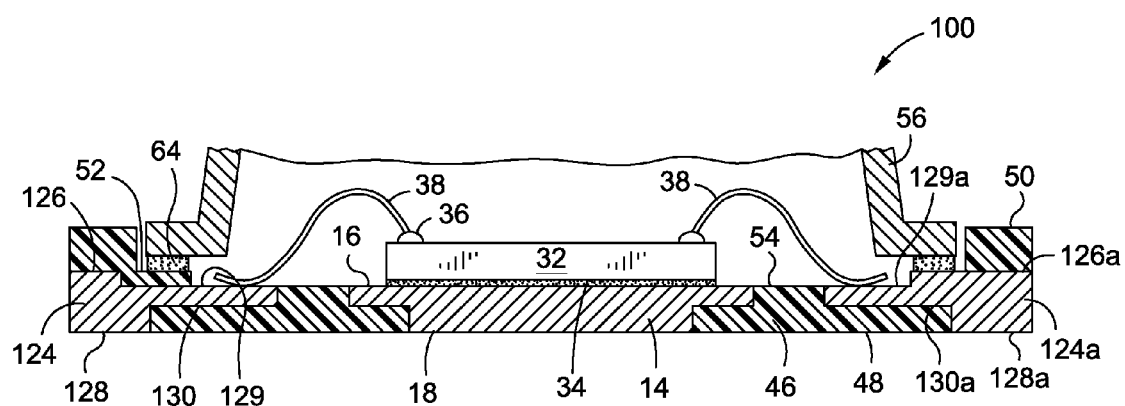
FIG. 4 is a cross-sectional view of a semiconductor package constructed in accordance with a second embodiment present invention.

Referring now to FIG. 4, there is shown a semiconductor package 100 constructed in accordance with a second embodiment of the present invention. The semiconductor package 100 is similar in structure to the above-described semiconductor package 10, with only the distinctions between the semiconductor packages 10, 100 being described below.

The primary distinction between the semiconductor packages 10, 100 lies in the elimination of the above-described vias 62 in the second section 52 of the semiconductor package 100, in favor of forming the leads 124, 124a thereof to have configurations varying from those of the leads 24 as allows for the exposure of portions of the leads 124a (but not the leads 124) in the second section 52. Thus, in the semiconductor package 100, the above-described leads 24 of the semiconductor package 10 are substituted with the leads 124, 124a. As seen in FIG. 4, each of the leads 124 defines a generally planar top surface 126 and an opposed, generally planar bottom surface 128. The bottom surface 128 of each of the leads 124 extends in generally co-planar relation to the bottom surface 18 of the die pad 14. Though the leads 124 may be formed to have any one of a multiplicity of differing shapes or configurations, each of the leads 124 is preferably formed to include an inner end portion which is angularly offset relative to the remainder thereof.

Each lead 124 of the semiconductor package 100 is subjected to a partial etching process which results in the inner end portion thereof being of a reduced thickness in comparison to the remainder of such lead 124. More particularly, each lead 124 is partially etched from both the top surface 126 and the bottom surface 128 as results in the formation of both a top etched surface 129 and an opposed, bottom etched surface 130. From the perspective shown in FIG. 4, the top etched surface 129 is recessed relative to the top surface 126, with the bottom etched surface 130 being recessed relative to the bottom surface 128. The top and bottom etched surfaces 129, 130 of each lead 124 define respective ones of the opposed top and bottom surfaces of the inner end portion thereof.

Similar to the leads 124, each of the leads 124a defines a generally planar top surface 126a and an opposed, generally planar bottom surface 128a. The bottom surface 128a of each of the leads 124a extends in generally co-planar relation to the bottom surface 18 of the die pad 14. Though the leads 124a may be formed to have any one of a multiplicity of differing shapes or configurations, each of the leads 124a is preferably formed to include an inner end portion which is angularly offset relative to the remainder thereof. Each lead 124 of the semiconductor package 100 is also subjected to a partial etching process which results in the inner end portion thereof being of a reduced thickness in comparison to the remainder of such lead 124a. More particularly, each lead 124a is partially etched from both the top surface 126a and the bottom surface 128a, which results in the formation of both a top etched surface 129a and an opposed, bottom etched surface 130a. From the perspective shown in FIG. 4, the top etched surface 129a is recessed relative to the top surface 126a, with the bottom etched surface 130a being recessed relative to the bottom surface 128a. The top and bottom etched surfaces 129a, 130a of each lead 124a define respective ones of the opposed top and bottom surfaces of the inner end portion thereof. As is seen FIG. 4, the primary distinction between the leads 124, 124a lies in the length of the top etched surface 129 of each lead 124 exceeding the length of the top etched surface 129a of each lead 124a.

In the semiconductor package 100, it is contemplated that the leads 124 will serve as the majority of those included in the four sets extending along and in space relation to respective ones of the peripheral edge segments defined by the die pad 14. In this regard, it is further contemplated that at least one of the leads 124 of at least one set thereof will be substituted with the lead 124a. However, those of ordinary skill in the art will recognize that several leads 124 of such set, or one or more leads 124 of more than one set thereof, may be substituted with the leads 124a, the present invention not being limited to any particular number or arrangement of the leads 124, 124a.

Due to the respective configurations of the leads 124, 124a as described above, the second section 52 of the top surface of the package body 46 included in the semiconductor package 100 is not continuous and uninterrupted. Rather, for any leads 124a included in the semiconductor package 100, that portion of the top surface 126a not covered by the portion of the package body 46 defining the third section 50 is exposed in and substantially flush or coplanar with the second section 52 of the top surface. Additionally, the top etched surface 129a of each lead 124a is exposed in and substantially coplanar with the first section 54, and is adapted to have any wire 38 extended into contact therewith. In contrast, for each lead 124, the top etched surface 129 extends in substantially coplanar relation to the first section 54, though it is partially covered by those portions of the package body 46 which define the second and third sections 52, 50 thereof. In this regard, the entirety of the top surface 126 of each lead 124 is covered by the package body 46, with no portion thereof being exposed in the second section 52. The bottom etched surfaces 130, 130a of the leads 124, 124a are, like the top surface 126 of each lead 124, completely covered by the package body 46.

Since, in the semiconductor package 100, a portion of the top surface 126a of any lead 124a included therein is exposed in the second section 52, the conductive adhesive material 64 used to secure the metal lid 56 to the package body 46 facilitates the electrical connection of the lid 56 to such lead(s) 124a in the manner shown in FIG. 4. However, no electrical connection is established between the lid 56 and any lead 124 due to that portion of the package body 46 defining the second section 52 of the top surface effectively being interposed between the adhesive material 64 and the top etched surface 129 of such lead 124 in the manner also shown in FIG. 4. Thus, in the semiconductor package 100, if the inner end portion of any lead 124a is extended so as to be connected to the die pad 14, an electrical path may be established between the metal lid 56 and the die pad 14 by such lead 124 and the conductive adhesive material 64 used to secure the lid 56 thereto without the necessity of having to form vias such as the above-described vias 62 within the package body 46. Those of ordinary skill in the art will recognize that the die pad 14 and the leads 124, 124a will typically have the plating layers shown in FIGS. 1 and 2 applied thereto, though they are not shown in FIG. 4.

An exemplary method of fabricating the semiconductor packages 10, 100 comprises the initial step of providing the leadframe 12 which includes either the leads 24 or the leads 124, 124a, and is partially encapsulated by the package body 46 having the above-described structural attributes. Thereafter, for the semiconductor package 10, the via(s) 62 is/are formed or ablated into the package body 46 in the orientation(s) described above. For the semiconductor package 100, no via(s) 62 is/are formed in the package body 46 thereof.

Next, the semiconductor die 32 is attached to the die pad 14 of the leadframe 12 in the aforementioned manner. The semiconductor die 32 is then wire bonded to the leads 24 (in the case of the semiconductor package 10) or to the leads 124, 124a (in the case of the semiconductor package 100) in the above-described manner through the use of the wires 38.

Upon the completion of the wire bonding process, the metal lid 56 is attached to the package body 46 in the aforementioned manner through the use of the conductive adhesive material 64. Such attachment facilitates the electrical connection of the lid 56 to the tie bar(s) 22 (and hence the die pad 14) and/or lead(s) 24 (in the case of the semiconductor package 10), or the electrical connection of the lid 56 to the lead(s) 124a (in the case of the semiconductor package 100). It is contemplated that the formation of the package body 46 in the semiconductor packages 10 and/or 100 may occur in several steps, with that portion of the package body 46 defining the bottom surface 48 and the first section 54 of the top surface being formed prior to the attachment of the semiconductor die 32 to the die pad 14, and that portion of the package body 46 defining the second and third sections 52, 50 of the top surface being formed subsequent to the completion of the wire bonding process.

It is contemplated that the semiconductor packages 10, 100 will be used in conjunction with a PCB which incorporates an electrical circuit between the die pad 14 of the semiconductor package 10, 100 and one or more ground planes within the motherboard design. When the semiconductor package 10, 100 (including the leads 24 or 124, 124a and exposed die pad 14) are soldered onto the application PCB motherboard, the device shield is complete, having placed the lid 56, die pad 14, and ground plane within the application board all at the same electrical potential. Though, in the semiconductor packages 10, 100, the leadframe 12 partially encapsulated by the package body 46 is described as defining the underlying substrate for the semiconductor die 32 and the lid 56, those of ordinary skill in the art will recognize that the concept of establishing the electrical connection between the metal lid 56 and a metalized area of a substrate to create an active circuitry shield may be extended to other semiconductor package structures, including those wherein the combination of the leadframe 12 and package body 46 are substituted with a different type of substrate. Further, in both the semiconductor packages 10, 100, it is contemplated that more one or more additional semiconductor dies may be stacked upon the semiconductor die 32 and electrically connected thereto, to each other and/or to the leadframe in a prescribed manner, without departing from the spirit and scope of the present invention. In this regard, as will be also be recognized by those of ordinary skill in the art, the number of stacked semiconductor dies which may be included in the semiconductor packages 10, 100 is limited only by the available clearance space defined between the interior surface 58 of the lid 56 and the top surface 16 of the die pad 14.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a leadframe including a die pad having at least one tie bar connected thereto and extending therefrom and a plurality of leads extending at least partially about the die pad in spaced relation thereto, each lead having a lead top surface and a lead bottom surface;
   a semiconductor die having a first surface and a second surface opposed to the first surface, the second surface attached to the die pad and electrically connected to at least some of the leads;
   a package body covering at least portions of the die pad, the tie bar and the leads where at least some leads each have both the lead top surface at least partially exposed in a top surface of the package body and the lead bottom surface at least partially exposed in a bottom surface of the package body, the package body including at least one via which is formed therein and terminates on the tie bar, the via being laterally surrounded by the package body, wherein:
   the top surface of the package body includes at least first and second sections, the first section being recessed relative to the second section;
   the via is formed in the second section of the top surface;
   the package body is formed such that the die pad, the tie bar and at least some of the leads each include a portion that is exposed in the first section of the top surface; and
   the top surface of the package body is positioned below the first surface of the semiconductor die;
   a conductive material within the via and contacting the tie bar; and
   a lid attached to the conductive material adjacent to the second section of the top surface of the package body to facilitate the electrical connection of the lid to the tie bar, wherein the tie bar comprises:
   a generally planar top surface adjacent the top surface of the package body, and
   a generally planar bottom surface disposed in opposed relation to the top surface and covered by the package body.

2. The semiconductor package of claim 1 wherein the semiconductor die is further electrically connected to the die pad, and wherein the package body does not cover the semiconductor die.

3. The semiconductor package of claim 2 wherein the semiconductor die is electrically connected to the die pad and at least some of the leads by conductive wires which are covered by the lid.

4. The semiconductor package of claim 1 wherein the via has a generally circular configuration, and wherein the semiconductor die is electrically connected to the die pad by a conductive wire attached to a terminal on the first surface of the semiconductor die and attached to the die pad so that the terminal, the die pad, the tie bar and the lid are configured to be in electrical communication.

5. The semiconductor package of claim 1, wherein those leads which include a portion exposed in the first section of the top surface of the package body each comprise:
   a generally planar top surface which is partially exposed in the first section of the top surface of the package body;
   a generally planar bottom surface which is disposed in opposed relation to the top surface and exposed in the bottom surface of the package body; and
   a shelf which is disposed in opposed relation to the top surface and recessed relative to the bottom surface, the shelf being covered by the package body.

6. The semiconductor package of claim 5 wherein the die pad comprises:
   a generally planar top surface which is exposed in the first section of the top surface of the package body;
   a generally planar bottom surface which is disposed in opposed relation to the top surface and exposed in the bottom surface of the package body; and
   a shelf which is disposed in opposed relation to the top surface and recessed relative to the bottom surface, the shelf being covered by the package body.

7. The semiconductor package of claim 1, wherein the top surface of the tie bar is partially exposed in the top surface of the package body.

8. The semiconductor package of claim 1 wherein:
   the package body is formed to include the at least one via which extends to the tie bar and is laterally surrounded by the package body, and at least one via which extends to a corresponding one of the leads and is laterally surrounded by the package body; and
   the vias are filled with the conductive material to facilitate the electrical connection of the lid to the tie bar and to at least one of the leads.

9. A semiconductor package comprising:
   a leadframe within a package body, the leadframe comprising a die pad and a plurality of leads extending at least partially about the die pad, each lead having a first surface and an opposing second surface;
   a semiconductor die having a first major surface and a second major surface opposed to the first major surface, the second major surface attached to the die pad and electrically connected to at least some of the leads;
   the package body covering at least portions of the leads where at least some leads each have both the first surface at least partially exposed in a top surface of the package body and the second surface at least partially exposed in bottom surface of the package body, the package body including at least one via which is formed therein and extends to a corresponding one of the leads, the via laterally surrounded by the package body;

a conductive material within the via and contacting the corresponding one of the leads; and a lid attached to the conductive material to facilitate electrical connection of the lid to the corresponding one of the leads, wherein:

the package body includes a bottom surface, and a top surface having at least first and second sections, the first section being recessed relative to the second section;

the via is in the second section of the top surface;

the lid is attached to the second section of the top surface; and the die pad and at least some of the leads each include a portion exposed in the first section of the top surface.

10. The semiconductor package of claim 9 wherein the semiconductor die is further electrically connected to the die pad by a conductive wire attached to a terminal on the first surface of the semiconductor die and the die pad.

11. The semiconductor package of claim 10 wherein the semiconductor die is electrically connected to the die pad and at least some of the leads by conductive wires which are covered by the lid, and wherein the first portion of the package body isolates at least some of the leads from the lid.

12. The semiconductor package of claim 9 wherein the via has a generally circular configuration.

13. The semiconductor package of claim 9, wherein those leads which include a portion exposed in the first section of the top surface of the package body each comprise:

a generally planar top surface which is partially exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

14. The semiconductor package of claim 13 wherein the die pad comprises:

a generally planar top surface which is exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

15. A semiconductor package comprising:

a die pad;

a semiconductor die attached to the die pad;

a plurality of leads extending at least partially about the die pad in spaced relation thereto, the semiconductor die being electrically connected to at least some of the leads, wherein each of the leads has a recessed top surface, a non-recessed top surface, a recessed bottom surface and a non-recessed bottom surface;

a package body covering at least portions of the die pad and the leads, the package body including a bottom surface, and a top surface having at least first and second sections, the first section being recessed relative to the second section, with a portion of the non-recessed top surface of at least one of the leads being exposed in the second section and portions of the recessed top surfaces of at least some of the leads being exposed in the first section; and a lid attached to the second section of the top surface of the package body by a conductive material and further attached to the non-recessed top surface of at least one of the leads exposed in the second section by the conductive material such that lid is electrically connected to the non-recessed top surface of at least one of the leads.

16. The semiconductor package of claim 15, wherein the semiconductor die is electrically connected to the die pad and at least some of the leads by conductive wires which are covered by the lid, and wherein at least some of the leads have inner end portions angularly offset relative to a remaining portion thereof.

17. The semiconductor package of claim 15 wherein:

the package body covers the recessed bottom surfaces of each of the leads; and the non-recessed bottom surfaces of each of the leads are exposed in the bottom surface of the insulative package body.

18. The semiconductor package of claim 17 wherein the die pad comprises:

a generally planar top surface which is exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

* * * * *